United States Patent [19]

Olsen et al.

[11] 4,112,473
[45] Sep. 5, 1978

[54] APPARATUS FOR DETERMINING A D-C POTENTIAL IN METAL-ENCAPSULATED HIGH VOLTAGE SWITCHING INSTALLATIONS AND EQUIPMENTS

[75] Inventors: Willi Olsen; Christian Pircher, both of Berlin, Fed. Rep. of Germany

[73] Assignee: Siemens Aktiengesellschaft, Munich, Fed. Rep. of Germany

[21] Appl. No.: 742,222

[22] Filed: Nov. 16, 1976

[30] Foreign Application Priority Data

Nov. 20, 1975 [DE] Fed. Rep. of Germany ....... 2552381

[51] Int. Cl.² .............................................. H02H 1/00
[52] U.S. Cl. ....................................... 361/1; 324/133
[58] Field of Search .................. 324/109, 133; 361/1, 361/107, 233; 174/11 BH, 11 R

[56] References Cited

U.S. PATENT DOCUMENTS 2,261,675  11/1941  Edler .................................... 324/109
3,701,944  10/1972  Amalric ...................... 175/11 BH X

FOREIGN PATENT DOCUMENTS 2,148,768  6/1972  Fed. Rep. of Germany.
209,673  8/1940  Switzerland.

OTHER PUBLICATIONS

"Oscillating–Electrode Voltmeters for the Measurement of High Direct Voltages" Rawcliffe, 1/1957 issue "Direct Current" pp. 85–87.

Primary Examiner—Harry E. Moose, Jr.
Attorney, Agent, or Firm—Kenyon & Kenyon, Reilly, Carr & Chapin

[57] ABSTRACT

A measuring device for measuring the d-c potential on the high-voltage conductor of a switching installation. The measuring device includes a first means which is responsive to the electric charge on the high-voltage conductor and a second means responsive to the first means for delivering a signal indicative of the d-c signal when such charge is present.

6 Claims, 1 Drawing Figure

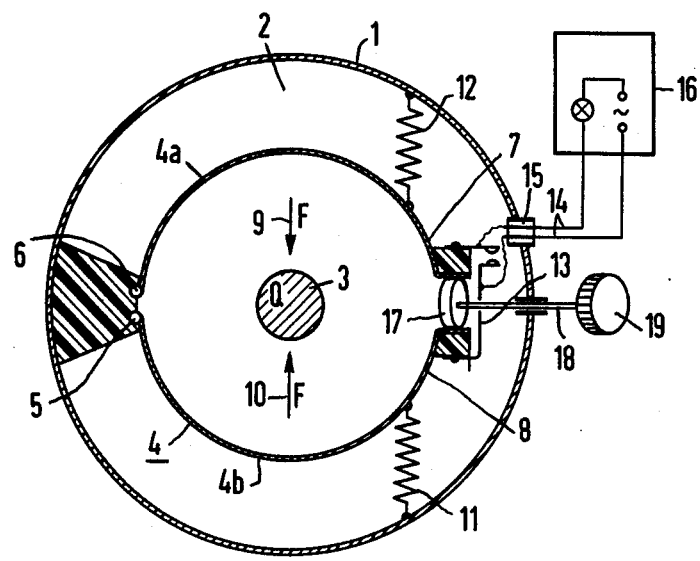

APPARATUS FOR DETERMINING A D-C POTENTIAL IN METAL-ENCAPSULATED HIGH VOLTAGE SWITCHING INSTALLATIONS AND EQUIPMENTS

BACKGROUND OF THE INVENTION

1. Field of the Invention

The invention relates to apparatus for determining a d-c potential in metal-encapsulated high-voltage switching installations and equipments and, in particular, installations and equipments which comprise at least one conductor carrying the high voltage and supported within a grounded encapsulation via insulators.

2. Description of the Prior Art

In metal-encapsulated high-voltage switching installations and equipments of the above-type, the conductor intended to carry the high-voltage a-c current can be grounded, so that it is possible for repair and maintenance personnel to work on the installation without danger. More particularly, in VDE (Society of German Electrical Engineers) Specifications 0105 Part 1, procedures are described under Item 5, which must be taken to secure and ensure a voltage-free condition of the high-voltage conductor before work can begin on the installation. The absence of voltage is in general ensured by providing in the installation grounding switches which tie the conductor electrically to the surrounding metal-encapsulation. However, before a grounding switch is operated, it is desirable to ascertain whether there is a voltage on the high-voltage conductor so as to avoid exposing the grounding switch to an arc.

The presence of an a-c voltage on the conductor can be determined by means of an electrode which is arranged in an insulated manner between the conductor and the encapsulation and which delivers a signal if an a-c voltage is present. Such a simple electrode arrangement, however, does not detect a d-c voltage on the conductor. Such a voltage may be present between the conductor and the encapsulation if, after the a-c supply lines have been disconnected, the high-voltage switching installation still carries electric charge due to the unavoidable capacities, particularly of cables.

It is an object of the present invention to provide an arrangement for detecting the d-c voltage on the high-voltage conductor of the above-described metal-encapsulated high-voltage switching installations.

SUMMARY OF THE INVENTION

In accordance with the principles of the present invention the above and other objectives are realized with a measuring device which includes a first means responsive to the electric charge on the conductor of the installation and a second means responsive to the first means for delivering a signal indicative of a d-c potential when such charge is present. Preferably, the second means is designed so that its output signal is used to lock the drive of a first grounding switch disposed within the switching installation. This ensures that the grounding switch is not operated if a d-c potential is present on the conductor.

In order that work can be performed on the installation without danger, it is also advantageous to close a further grounding switch or power circuit breaker which is provided as a rule and can be separated from the first grounding switch, which may be associated, for instance with a branch cable. In such case the part of the electric conductor associated with the first grounding switch is grounded after the undesired charge on the other part of the conductor has been removed by closing the power circuit breaker. As a result, if the aforesaid charge leads to an arc-over during the closing of the power circuit breaker, such arc-over takes place in the power circuit breaker which has an arc-quenching device for extinghishing arcs. Thereupon, the first grounding switch can also be closed without the danger of an arc-over. Arc-overs in grounding switches are as a rule undesirable if the installation is to be operated with a minimum of maintenance, as every arc-over can lead to a degradation of the insulation in the section of the encapsulation which contains the grounding switch.

The first means of the measuring device of the invention is preferably in the form of a body which operates a switching device and is movably arranged at a distance from the conductor in the interior of the encapsulation. More particularly, in the embodiment of the invention to be disclosed hereinafter, the first means of the measuring device comprises a hollow cylinder which surrounds the conductor and is separated therefrom by an insulated space. The aforesaid hollow cylinder is split along its axis to from two half-shells which are movably supported via hinge bearings. These half-shells also contain between them a contact system which is actuated, e.g., closed, if a d-c potential is present on the conductor. In particular, the contacts are actuated by the Coulomb force on the movable half-shells by charge on the conductor. In this embodiment, the movable half-shells are also arranged so as to be insulated from the metal-encapsulation. Thus, the movable half-shells can also be used as an electrode for detecting a-c voltages, e.g., as the high-potential capacitor of voltage transformers or as an electrode for generating a signal for the on and off position of an electric switch arranged inside the encapsulation. For this purpose, the measuring device is further provided with a setting device by means of which the movable half-shells can be secured, i.e., fixed, in their position relative to the conductor.

In accordance with a further aspect of the invention, the first means of the measuring device is in the form of a semi-conductor element which is responsive to the electrostatic field from the conductor.

BRIEF DESCRIPTION OF THE DRAWINGS

The above and other features and aspects of the present invention will become apparent upon reading the following detailed description in conjunction with the accompanying drawings, in which:

The drawing shows a measuring device in accordance with the principle of the present invention.

DETAILED DESCRIPTION

The drawing shows a cross section through a high-voltage switching installation comprising an encapsulation 1 which is in the form of a metallic, electrically conducting tube. The interior of the encapsulation 1 is filled with a gaseous insulating medium such as, for example, sulfur hexafluoride ($SF_6$), at a pressure of, for instance, 4 bar. Also disposed within the interior of the encapsulation 1 is a high-voltage conductor 3, which is braced against the encapsulation 1 by means of disc-like support insulators which are not specifically shown.

After the switching installation is switched off, the electric conductor 3 still may contain charge which causes a d-c potential to exist between the encapsulation 1 and the conductor 3. In accordance with the invention, a measuring device 4 is provided which is responsive to this charge and which delivers a signal indicative of the presence of a d-c potential when such charge is present. In the present illustrative example, the measuring device comprises a hollow cylinder which is split along its axis to form two half-shells 4a, 4b.

As shown, the half-shells 4a and 4b have stationary hinge bearings 5, 6 connected to the encapsulation 1. As a result, the free edges 7, 8 of the shells move toward each other under the action of the coulomb force F which acts in the direction of the arrows 9–10 and is caused by the electric charge on the conductor 3. Since for reasonable dimensions of the half-shells 4a and 4b, i.e., for shells with a length not exceeding 1 meter, coulomb forces in the order of 5 newtons can be obtained, advantageously, means is also provided for balancing the weight of the half-shells. As shown, such means comprises spring elements 11, 12 which are arranged in an insulated manner between the halfshells 4b and 4a and the metal encapsulation. The shells 4a and 4b, in the regions of their free edges 7 and 8, are additionally provided with contacts which form a contact system 13 which is closed under the influence of the Coulomb force F, when a d-c potential is present. These contacts are connected, in turn via lines 14 and a gastight feedthrough 15 in the encapsulation 1 to a measuring circuit 16.

Between the two free edges 7 and 8 of the half-shells 4a, 4b, is further arranged a setting device 17 which is designed in the form of a cam. The cam 17 is mounted on a shaft 18 which can be operated by a handle 19 accessible from outside the encapsulation 1. By means of the setting device 17, the initial spacing between the two movable half-shells can be set.

Due to the insulated arrangement of the springs 11, 12 and the insulated attachment of the hinge bearings 5 and 6, the measuring device of the invention is metallically separated from the conductor 3 as well as from the encapsulation 1. The measuring device can, therefore, also be used for measuring the a-c potential on the conductor 3, when the half-shells 4a, 4b are secured in their position by the setting device 17.

It should be noted that several movable bodies may be used to form the measuring device of the invention instead of just the two movable half-shells 4a and 4b. Also, the movement of each movable part may be limited and the total movements of all parts to generate the desired signal. In such case the apparatus can operate independently of position.

In a further aspect of the invention, the measuring device may take the form of a semiconductor element arranged between the encapsulation 1 and the conductor 3 in such a manner that the semiconductor barrier layer is influenced by the electrostatic field caused by the charge on the conductor 3. In this case, the influence on the barrier layer can be utilized to generate the desired signal.

Both of the above-described measuring devices of the present invention generate a signal if there is a d-c potential on the conductor 3. Thus, with the invention, an unequivocal control can be exercised on the grounding switch associated with the conductor 3 in such a manner that the drive of the grounding switch is locked if charge is present. This permits the use of more inexpensive, slow-acting grounding switches instead of expensive, fast-acting grounding switches. It also eliminates the danger of their occurring a preliminary breakdown when the grounding switch is operated, which could lead to large expenditures for maintenance and cleaning work inside the encapsulation and at the grounding switch.

What is claimed is:

1. Apparatus for determining the d-c potential in a metal-encapsulated switching installation equipped with at least one high-voltage conductor supported by insulators within a grounded encapsulation, the apparatus comprising:
   a measuring device including:
      a first means responsive to the charge on said conductor, said first means including a hollow cylinder surrounding said conductor and spaced therefrom by an insulated space, said hollow cylinder being split along its axis to form two pivotably supported half-shells;
      and a second means responsive to said first means for delivering a signal when said d-c potential is present, said second means including a switching device responsive to said cylinder.

2. Apparatus in accordance with claim 1 in which said measuring device further includes:
   a grounding switch for connecting the conductor to the encapsulation in an electrically conducting manner, said switch having drive which is locked in response to said signal.

3. Apparatus in accordance with claim 1 in which: each of said half-shells includes a hinge bearing for pivotably mounting said half-shell.

4. Apparatus in accordance with claim 1 in which: facing ends of said half-shells contain contacts which together form a contact system which is actuated when said d-c potential is present.

5. Apparatus in accordance with claim 1 in which: said pivotable half-shells are insulated from said encapsulation.

6. Apparatus in accordance with claim 1 in which said measuring device further includes:
   means for securing said half-shells from pivoting.

* * * * *